INVENTOR.
FRANZ L. SAUERLAND
BY
ATTORNEY

Oct. 24, 1967 F. L. SAUERLAND 3,349,347

ELECTRIC WAVE FILTER

Filed Oct. 8, 1962 3 Sheets-Sheet 2

INVENTOR.
FRANZ L. SAUERLAND
BY
Elmer J. Hyde
ATTORNEY

Oct. 24, 1967 F. L. SAUERLAND 3,349,347

ELECTRIC WAVE FILTER

Filed Oct. 8, 1962 3 Sheets-Sheet 3

INVENTOR.
FRANZ L. SAUERLAND
BY
ATTORNEY 3,349,347
Patented Oct. 24, 1967

3,349,347

ELECTRIC WAVE FILTER

Franz L. Sauerland, Cleveland, Ohio, assignor to Clevite Corporation, a corporation of Ohio Filed Oct. 8, 1962, Ser. No. 229,118
1 Claim. (Cl. 333—72)

This invention relates to electric wave filters and, in particular, to wave filters of the hybrid lattice bandpass type.

The hybrid lattice filter has been known in theory and practice for decades. Early disclosures of such filters include U.S. Letters Patent No. 2,001,387 to C. H. Hansell (1935) and No. 2,266,658 to J. Robinson (1941), to mention only two.

The hybrid lattice network with an ideal transformer is equivalent to a full symmetric lattice while having the advantage of lower cost and smaller size stemming from the fact that it embodies fewer components. This and its unbalanced structure make the hybrid lattice network particularly adapted to filters employing piezoelectric resonators. In theory, they could be fabricated of only three components: two resonators and an ideal transformer.

One difficulty in the realization of such a filter arises from the use of a real transformer—with its losses, finite inductance and imperfect coupling—in place of the ideal. These parameters of a real transformer introduce undesired amplitude and phase effects which distort the passband of the filter.

In an effort to minimize the effects of the real transformer, the parameters of which are maintained as close to ideal as possible, a capacitor for tuning the transformer to a frequency in the passband range is sometimes resorted to. For reasons to be explained later, this method requires broad tuning of the transformer.

The present invention is based on the discovery that narrow—as opposed to broad—tuning of the transformer in a hybrid lattice filter, in conjunction with appropriate adjustment of the lattice parameters, makes possible a very considerable improvement in the selectivity of the network.

The fundamental object of the present invention, therefore, is the design of hybrid lattice filters with better selectivity and higher stop band rejection than comparable conventional hybrid lattice filters.

The advantages of the invention, its additional objects, scope, and the manner in which it may be practiced will be more fully apparent to persons conversant with the art from the following description of exemplary embodiment thereof read in conjunction with the subjoined claims and annexed drawings wherein like reference numerals denote like parts throughout the several views and:

FIGURE 1*a* is a schematic diagram of a hybrid lattice network;

FIGURE 1*b* is the schematic diagram of a complete symmetric lattice network equivalent to the hybrid lattice of FIGURE 1*a*;

Figure 3:
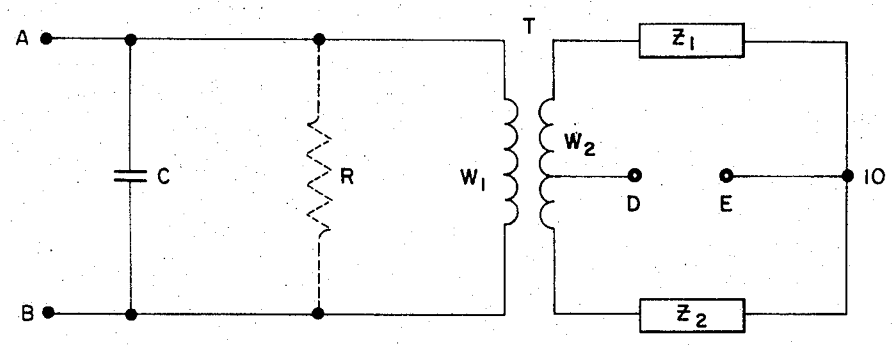
FIGURE 3 is a schematic diagram exemplifying a basic form of tuned hybrid lattice bandpass filter as contemplated by the present invention.

Referring to FIGURE 3, a filter in accordance with the present invention comprises a transformer T, a pair of piezoelectric resonators $Z_1$ and $Z_2$ and a capacitor C. Transformer T includes a pair of inductively coupled windings $W_1$ and $W_2$, the latter having a tap which may or may not be at the winding center. Winding $W_1$ is connected between input terminals A and B and is shunted by capacitor C. Resonators $Z_1$ and $Z_2$ are connected in series with winding $W_2$ of the transformer T. Output terminals D and E are connected respectively to the tap on winding $W_2$ and the junction point 10 between the resonators $Z_1$, $Z_2$. The resistor R (shown in dotted lines) is not physically present in the network; it will be used as an aid in explaining the behavior of the network.

The circuit structure of FIGURE 3 basic to the invention is identical to one which has been described in the prior art. The difference between the two designs lies in the choice of the circuit parameter values. To show that this difference is essential and to distinguish the novelty of the invention, the pertaining prior art is summarized here.

Figure 1A:
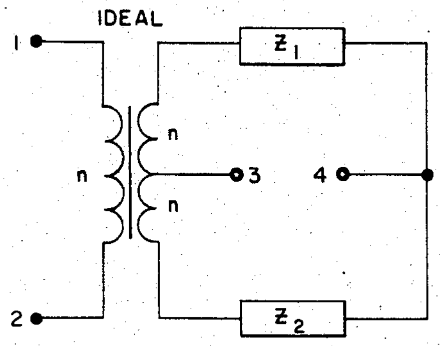
Figure 2:
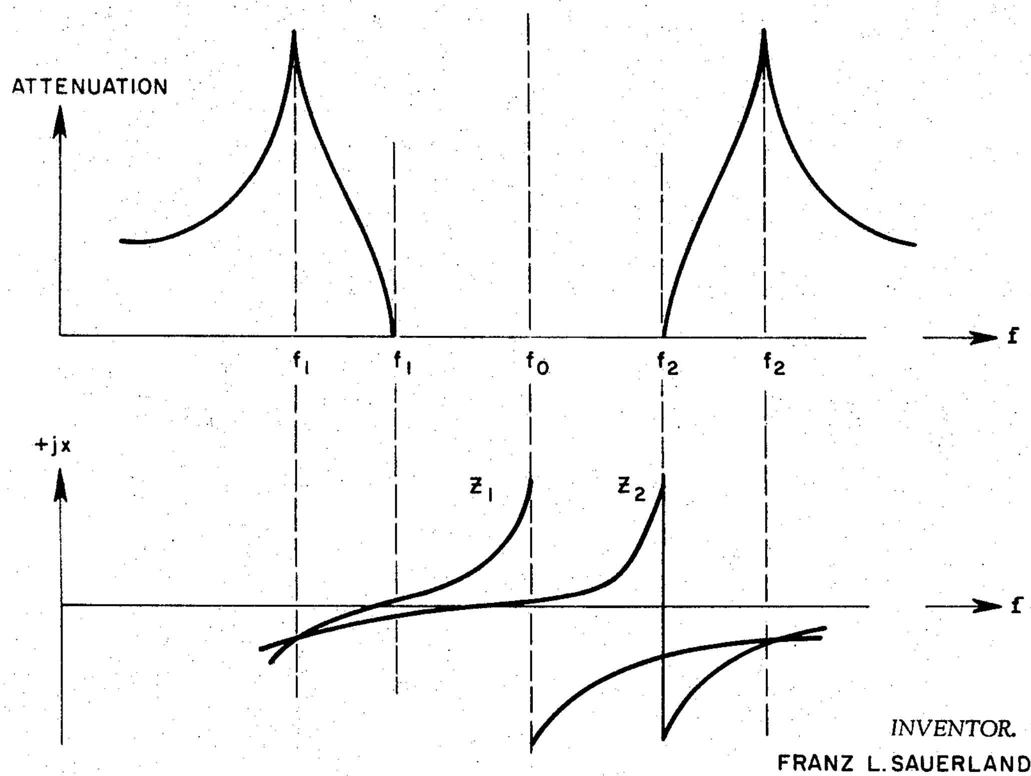
FIGURE 2 illustrates the attenuation of a symmetric response hybrid lattice bandpass filter and the pole—zero distribution of its lattice—branch impedances.

Hybrid lattice bandpass filters of the configuration shown in FIGURE 1*a* are conventionally designed with image parameter techniques. The reactances of their resonators $Z_1$ and $Z_2$ generally have the pole-zero distribution of FIGURE 2, which assures a real value for the image impedance in the filter passband.

As mentioned before, the substitution of a real transformer for an ideal transformer may cause distortions and unsymmetries in the filter passband. To reduce these undesired effects, the transformer characteristics are kept as close to the ideal characteristics as is practically feasible. In addition, a tuning capacitor C is sometimes introduced which may partially compensate for the abovementioned undesired effects. The corresponding network is shown in FIGURE 3.

The requirement for approximately ideal transformer characteristics implies a high transformer inductance L. As a result, the loaded Q (quality factor) of the tuned transformer has a small value. This becomes apparent from FIGURE 3. The loading effect of the filter terminations and the transformer losses on the tuned-transformer circuit may be represented by the resistance R. The loaded Q is $Q=R/\omega_0 L$. Its value decreases with increasing transformer inductance L. Hence the requirement for a small value of the loaded Q is an essential one in the prior art. This fact is sometimes (for example U.S. Patent No. 2,266,658) expressed in equivalent terms as the requirement for broad tuning of the transformer.

Figure 1B:
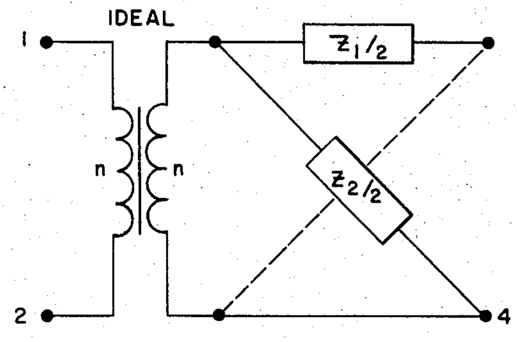

The reason for this requirement is the observation that the filter passband becomes distorted if the value for the loaded Q is increased. This may be explained by the fact that the equivalence of FIGURES 1*a* and 1*b*—which is the basis for the conventional filter design—does no longer hold for increased values of Q, i.e., decreased transformer inductance.

The explanation may be supported by another argument. The network of FIGURE 3 is symmetric only if the ratio L/C is infinite. If L/C is finite, the network becomes unsymmetric. Unless a substantial reduction in bandwidth is accepted, the network parameters can no longer be adjusted such that the image impedance is real throughout the passband. As a consequence, stop bands appear within the passband, causing ripple and unsymmetries in the filter response. These effects become more severe with decreasing ratio L/C, or, correspondingly, increasing values of Q.

The necessity for broad tuning in the prior art serves to emphasize one essential difference between the conventional and the new design. The present invention offers a substantially improved filter response by prescribing narrow (as opposed to broad) transformer tuning in conjunction with an appropriate adjustment of the lattice parameters.

Basic to the invention is the idea of utilizing the tuned transformer of the hybrid lattice network for contributing significantly to the selectivity of the filter. To achieve this result, the transformer has to be narrow-tuned, which is not feasible in the conventional design for the reasons given above. However, it proves to be highly effective if the design approach is drastically changed.

The design goal is a hybrid lattice filter of the form FIGURE 3 or an equivalent form with symmetrical amplitude response, maximum selectivity and stop band rejection, and minimum passband ripple.

For the network considered no conventional design method is readily available. Unless a substantial reduction in bandwidth is accepted, image parameter techniques are not applicable. For lack of an analytical design method, the following approach is used.

Figure 4:
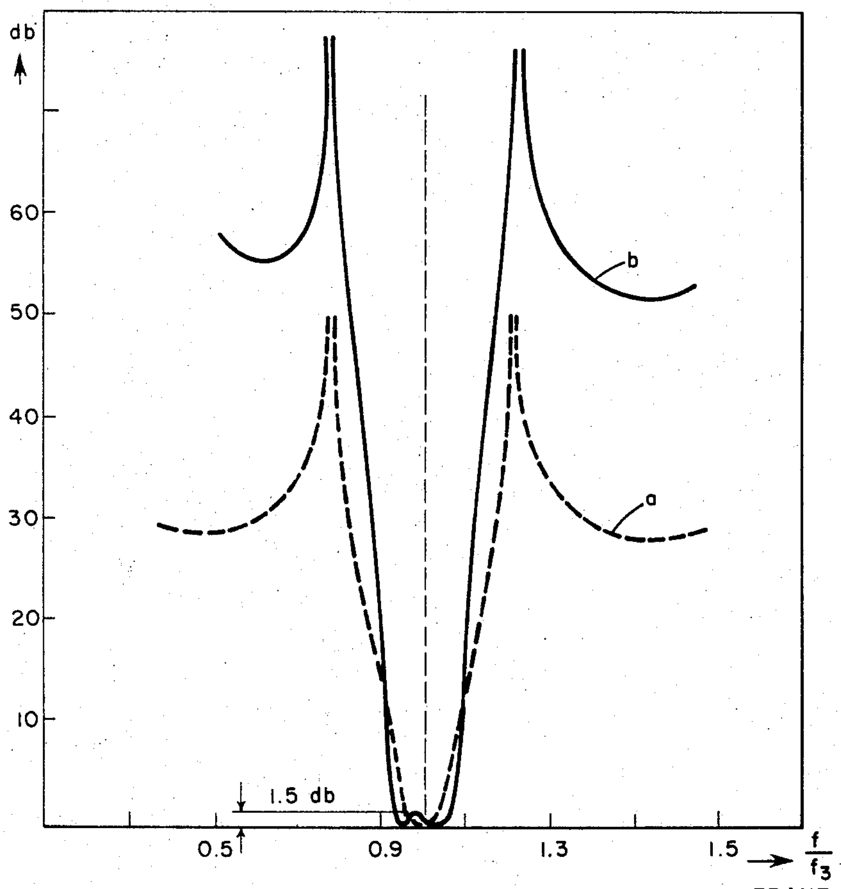
FIGURE 4 is a graphic comparison of the response characteristic of a hybrid lattice filter of conventional design with the response characteristic of a hybrid lattice fitler embodying the present invention.

The amplitude response of the network of FIGURE 3 for given generator and load impedances is expressed mathematically as a function of the filter parameters. Then, that particular combination of parameter values is evaluated which produces an optimum filter response. Curve *b* of FIGURE 4 shows a resulting filter response. Compared to the response of a hybrid lattice filter of conventional design, curve *a* of FIGURE 4, the proposed design offers a considerable improvement in both selectivity and stop band rejection.

As mentioned before, one distinguishing feature of the new design is the requirement for narrow tuning. Just how narrow this tuning is to be depends on the filter requirements. In general, the value for the loaded Q of the transformer approximates that for the reciprocal relative filter bandwidth. More specific values will be quoted later.

Figure 5:
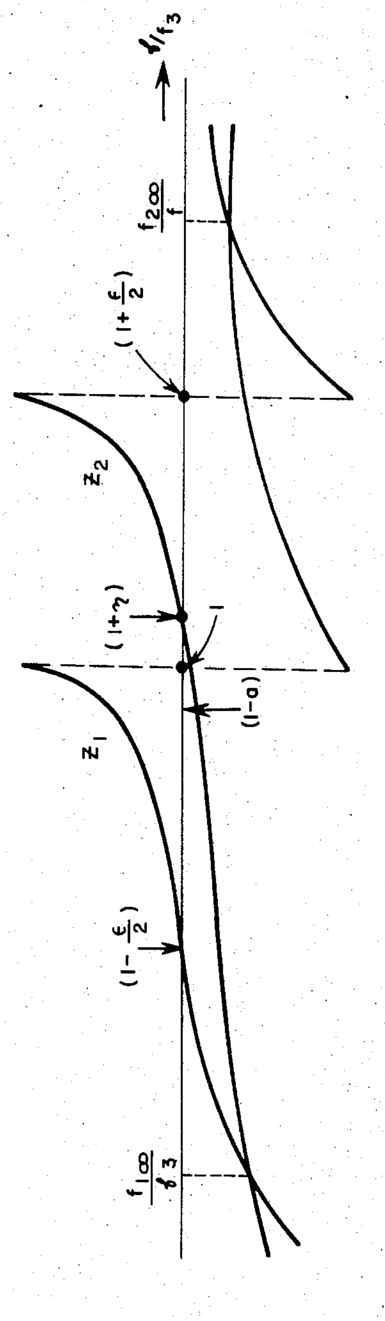
FIGURE 5 shows a possible reactance distribution for the resonators of the tuned hybrid lattice filter embodying the present invention.

Another distinguishing feature of the new design is the fact that the response of the basic lattice by itself has to be unsymmetric in order to obtain a symmetric response for the composite filter. Such a basic lattice may be designed in a number of ways. FIGURE 5 indicates a possible reactance distribution for the resonators of such a lattice, where $\epsilon$=relative filter bandwidth
$f_0$=center frequency $$=(1-a)f_3=\frac{f_\infty - f_\infty}{2}$$

$f_{1\infty}$=frequency of lower attenuation pole
$f_{2\infty}$=frequency of upper attenuation pole
$Z_1$, $Z_2$=resonator reactances The present design approach does not yield an analytical relationship between the specifications and the parameter values of the filter. Hence, the process of evaluating the parameter values has to be repeated for any new set of filter specifications (this is presently done with the help of a digital computer). However, if the range of specifications is limited, certain generalized design principles may be derived.

For example, a frequency specified value for the minimum rejection level of bandpass filters is 60 db. For this value, the following approximate generalizations for the described hybrid lattice filter hold:

(1) The value for the optimum 60/6 db skirt ratio obtained for the filter response is 4.

(2) The value for the optimum loaded Q is $Q=1.5/\epsilon$, where $\epsilon$ is the relative (6 db) filter bandwidth.

(3) The resonant frequency of the tuned transformer lies within the filter passband.

(4) Assuming a basic lattice with the pole-zero distribution of FIGURE 5, the normalized frequency deviation $\eta$ is $\eta=0.05\epsilon$, and the normalized frequency deviation $0_2$ is $0_2=0.1\epsilon$.

With these values and the definitions of FIGURE 5, the parameters of the lattice resonators may be evaluated.

Figure 6B:
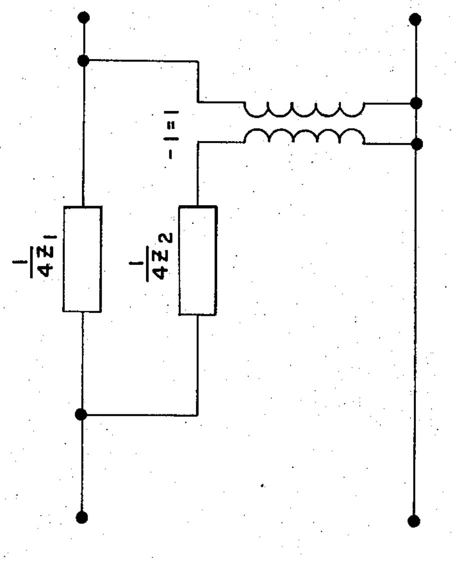
FIGURES 6*a* and 6*b* show schematic diagrams of networks equivalent to the hybrid lattice network of FIGURE 1*a*.
Figure 6A:
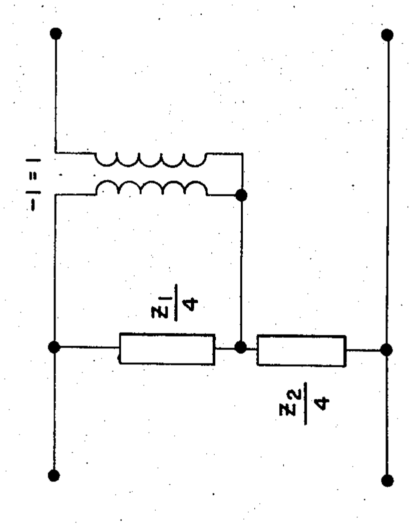

The invention is not restricted to the network of FIGURE 3. The basic principle, i.e., the utilization of the tuned transformer for a significant contribution to the selectivity of the filter, may be applied to networks equivalent to that of FIGURE 1*a*. For example, it may be applied to the full-lattice network of FIGURE 1*b* or to the equivalent networks of FIGURES 6*a* and 6*b*. Further, the impedances $Z_1$ and $Z_2$ appearing in FIGURE 1*a* or its equivalent circuits need not be the impedances of individual resonators. Rather, $Z_1$ and $Z_2$ may also represent the impedances of a combination of resonators, or, in general, the impedances of frequency dependent network elements. Also, C may be across the secondary.

While there have been described what at present are believed to be the preferred embodiments of this invention, it will be obvious to those skilled in the art that various changes and modifications may be made therein without departing from the invention, and it is aimed, therefore, to cover in the appended claims all such changes and modifications as fall within the true spirit and scope of the invention.

What is claimed and desired to be secured by United States Letters Patent is:

Electric bandpass filter of the hybrid lattice type comprising: a pair of input and a pair of output terminals; only one inductive transformer connected to one of said terminal pairs, a capacitance to tune said transformer to a passband frequency, a tap on said transformer connected to one of the remaining terminals, a pair of reactive lattice branch impedances containing respective electromechanical resonators of substantially different characteristic frequencies, selected to produce spaced poles of attenuation defining a passband therebetween, each connected between opposing sides of the transformer and between the remaining terminal, the value for the loaded Q of the transformer being approximately equal to 1.5 divided by the relative filter bandwidth.

References Cited

UNITED STATES PATENTS

| | | | |
|---|---|---|---|
| 2,001,387 | 5/1935 | Hansell | 333—72 |
| 2,266,658 | 12/1941 | Robinson | 333—72 |
| 2,452,114 | 10/1948 | Farkas | 333—74 |
| 2,929,031 | 3/1960 | Kosowsky | 333—72 |
| 2,959,752 | 11/1960 | Kosowsky | 333—72 |
| 2,980,872 | 4/1961 | Storch | 333—74 |
| 2,990,525 | 6/1961 | Grant | 333—74 |

OTHER REFERENCES

Dishal: Condensed Version of Modern Network Theory Design Data For One Class of Crystal Filters, IRE National Convention Record, part 8 of 1957, pp. 6–12.

HERMAN KARL SAALBACH, *Primary Examiner.*

WALTER L. CARLSON, *Examiner.*

C. BARAFF, *Assistant Examiner.*